(12) United States Patent
Zhang et al.

(10) Patent No.: US 11,791,166 B2
(45) Date of Patent: Oct. 17, 2023

(54) SELECTIVE ETCH PROCESS USING HYDROFLUORIC ACID AND OZONE GASES

(71) Applicants: Mattson Technology, Inc., Fremont, CA (US); Beijing E-Town Semiconductor Technology, Co., LTD, Beijing (CN)

(72) Inventors: Qi Zhang, San Jose, CA (US); Haichun Yang, San Jose, CA (US); Hua Chung, Saratoga, CA (US); Ting Xie, Fremont, CA (US); Michael X. Yang, Palo Alto, CA (US)

(73) Assignees: BEIJING E-TOWN SEMICONDUCTOR TECHNOLOGY CO., LTD, Beijing (CN); MATTSON TECHNOLOGY, INC., Fremont, CA (US)

( * ) Notice: Subject to any disclaimer, the term of this patent is extended or adjusted under 35 U.S.C. 154(b) by 40 days.

(21) Appl. No.: 17/532,143

(22) Filed: Nov. 22, 2021

(65) Prior Publication Data
US 2022/0084839 A1   Mar. 17, 2022

Related U.S. Application Data

(63) Continuation of application No. 17/071,293, filed on Oct. 15, 2020, now Pat. No. 11,183,397.
(Continued)

(51) Int. Cl.
*H01L 21/3213* (2006.01)
*H01L 21/311* (2006.01)
*H01L 21/3065* (2006.01)

(52) U.S. Cl.
CPC .... *H01L 21/32136* (2013.01); *H01L 21/3065* (2013.01); *H01L 21/31116* (2013.01); *H01L 21/32135* (2013.01)

(58) Field of Classification Search
None
See application file for complete search history.

(56) References Cited

U.S. PATENT DOCUMENTS 8,314,022 B1   11/2012   Foster et al.
8,921,234 B2   12/2014   Liu et al.
(Continued)

OTHER PUBLICATIONS

Y. Lee and S.M. George, "Thermal Atomic Layer Etching of TiTanium Nitride Using Sequential, Self-Limiting Reactions: Oxidation to TiO2 and Fluorination to Volatile TiF4", Chemistry of Materials, vol. 29, pp. 8202-8210. (Year: 2017).*
(Continued)

*Primary Examiner* — Jiong-Ping Lu
(74) *Attorney, Agent, or Firm* — Dority & Manning, P.A.

(57) ABSTRACT

Systems and methods for etching titanium containing layers on a workpiece are provided. In one example, a method includes placing the workpiece on a workpiece support in a processing chamber. The workpiece includes a first layer and a second layer. The first layer is a titanium containing layer. The method includes admitting a process gas into the processing chamber. The process gas includes an ozone gas and a fluorine containing gas. The method includes exposing the first layer and the second layer on the workpiece to the process gas to at least partially etch the first layer at a greater etch rate relative to the second layer.

6 Claims, 8 Drawing Sheets

Related U.S. Application Data

(60) Provisional application No. 62/923,002, filed on Oct. 18, 2019.

(56) References Cited

U.S. PATENT DOCUMENTS

| | | |
|---|---|---|
| 9,040,422 B2 | 5/2015 | Wang et al. |
| 2008/0038932 A1 | 2/2008 | Wagner |
| 2012/0052678 A1 | 3/2012 | Sapra et al. |
| 2012/0238103 A1 | 9/2012 | Zhang et al. |
| 2018/0261476 A1 | 9/2018 | Ouchi |

OTHER PUBLICATIONS

K.R. Williams et al., "Etch Rates for Micromachining Processing—Part II", Journal of Microelectromechanical System, vol. 12, pp. 761-778. (Year: 2003).*

Lee et al., "Thermal Atomic Layer Etching of Titanium Nitride Using Srquential, Self-Limiting Reactions: Oxidation to $TiO_2$ and Fluorination to Volatile $TiF_4$" Chemistry of Materials Article, 2017, 9 pages.

International Search Report and Written Opinion for Application No. PCT/US2020/055910, dated Feb. 10, 2021, 11 pages.

Williams et al., "Etch Rates for Micromachining Processing—Part II", Journal of Microelectromechanical System, vol. 12, 2003, pp. 761-778.

* cited by examiner

SELECTIVE ETCH PROCESS USING HYDROFLUORIC ACID AND OZONE GASES

PRIORITY CLAIM

The present application claims the benefit of priority of U.S. application Ser. No. 17/071,293, filed on Oct. 15, 2020, titled "Selective Etch Process Using Hydrofluoric Acid and Ozone Gases," and U.S. Provisional Application Ser. No. 62/923,002, filed Oct. 18, 2019, titled "Selective Etch Process Using Hydrofluoric Acid and Ozone Gases," which are incorporated herein by reference.

FIELD

The present disclosure relates generally to processing of workpieces, such as semiconductor workpieces.

BACKGROUND

The processing of semiconductor workpieces can involve the deposition and removal of different materials layers on a substrate. Device dimension and materials thickness continue to decrease in semiconductor processing with shrinking critical dimensions in semiconductor devices. In advanced device nodes, material removal with high selectivity to other material can become increasingly important to semiconductor device performance. For instance, in some structures, titanium and/or titanium nitride etch relative to other materials can be of particular importance as such etch can gain widespread applications in semiconductor devices.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The method includes placing the workpiece on a workpiece support in a processing chamber. The workpiece includes a first layer and a second layer. The first layer is a titanium containing layer. The method includes admitting a process gas into the processing chamber. The process gas includes an ozone gas and a fluorine containing gas. The method includes exposing the first layer and the second layer on the workpiece to the process gas to at least partially etch the first layer at a greater etch rate relative to the second layer.

Other example aspects of the present disclosure are directed to systems, methods, and apparatus for processing of workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
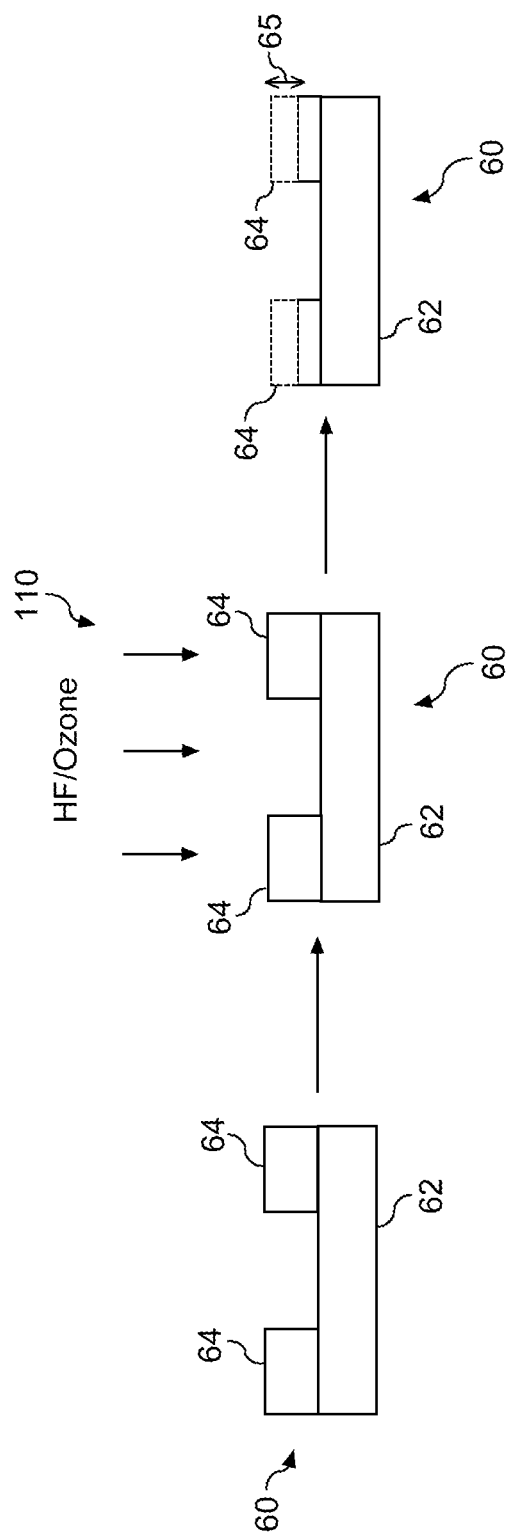
FIG. 1 depicts an overview of an example etch process according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to an etch process for etching titanium and/or titanium nitride relative to other materials on workpieces, such as semiconductor workpieces, such as semiconductor wafers. With the increasing complexity of semiconductor device fabrication process(s) and the continuous shrinking of device size(s), the requirement of etch selectivity in semiconductor fabrication processes is becoming increasingly stringent. In certain applications, such as hardmask removal process(s), titanium and/or titanium nitride may need to be removed from a workpiece at a high selectivity relative to other materials, such as silicon, silicon germanium, silicon nitride, silicon dioxide, tungsten, tantalum nitride, metal layers, and other materials. Plasma based processes can expose a workpiece to fluorine radicals to etch titanium and/or titanium nitride on a semiconductor workpiece. However, use of fluorine radicals can suffer from low selectivity relative to certain materials, such as silicon and silicon germanium.

According to example aspects of the present disclosure, systems and methods for processing a semiconductor workpiece can provide for selective etch of titanium and/or titanium nitride layers on a workpiece relative to other materials by exposing the workpiece to a co-flow of hydrofluoric acid (HF) gas and ozone gas. For instance, in some embodiments, a process for etching a titanium and/or titanium nitride layer selectively relative to other layers on the workpiece can include exposing the workpiece to a process gas in a processing chamber. The process gas can include both HF gas and ozone gas. In some embodiments, the process gas can include HF vapor. In some embodiments, the process gas can include oxygen gas ($O_2$) and/or a carrier gas (e.g., oxygen, nitrogen, helium, argon, neon, or other inert gas). The active components of the process gas (e.g., the HF gas/vapor and the ozone gas) can be flowed into the processing chamber simultaneously.

In some embodiments, the HF gas (e.g., HF vapor) can be directly delivered to the processing chamber from an HF source (e.g., HF bottle). In addition, and/or in the alternative, the HF gas can be formed by a remote plasma using a remote plasma source. For instance, an inductively coupled plasma can be generated in a remote plasma chamber (e.g., separated from the processing chamber bye a separation grid) from a process gas in the plasma chamber. The process gas in the plasma chamber can include F containing gas(s) (e.g., $CF_4$, $NF_3$, $CF_xH_y$, etc.) and H containing gas(s) (e.g., $H_2$, $CH_4$, $C_2H_8$, etc.). The HF radicals generated in the plasma can be delivered downstream from the plasma chamber to the processing chamber to be exposed to the workpiece.

In some embodiments, the ozone gas can be directly delivered to the processing chamber from an ozone gas source (e.g., ozone generator). The ozone gas can include $O_3$ and accompanying $O_2$ gas. The concentration of $O_3$ in the ozone gas can be in the range of about 1% to about 50% by volume.

According to example aspects of the present disclosure, the ozone gas and the HF gas can be co-flowed into the processing chamber for exposure to the workpiece to selectively etch titanium and/or titanium nitride selectively relative to another material on the workpiece. The other material can include, for instance, silicon, polysilicon, silicon germanium, silicon nitride, silicon dioxide, metal(s) (e.g., tungsten), tantalum nitride, low-k material(s), etc. In some embodiments, exposure of the workpiece to the co-flow of HF gas and ozone gas can result an a high etch rate of titanium nitride and/or titanium, such as an etch rate of about 200 Angstroms per minute or higher. The etch profile for the titanium and/or titanium nitride can be isotropic. The process can at least partially etch titanium and/or titanium nitride at a greater etch rate relative to other materials on the workpiece.

Example aspects of the present disclosure can provide a number of technical effects and benefits. For instance, the systems and methods according to example aspects of the present disclosure can provide for etch of titanium and/or titanium nitride with high selectivity towards of the materials, including silicon and silicon germanium. The methods can be implemented as an all dry process with a high etch rate for titanium and/or titanium nitride. In certain embodiments, the process gas can be introduced directly into a processing chamber without requiring a remote plasma source.

In some embodiments, the HF gas and the ozone gas can be provided to the processing chamber for exposure to the workpiece sequentially in a cycling manner. A first portion of each cycle can deliver HF gas (plus carrier gas). A second portion of each cycle can deliver ozone gas. The cycles can be repeated. The cyclic process can etch titanium nitride and/or titanium in an atomic layer etching (ALE) manner to remove a small number of Angstroms (e.g. about 1 to about 5 Angstroms) of titanium nitride and/or titanium per cycle. This can provide for precise control of the etching process by control of the number of cycles.

Aspects of the present disclosure provide a number of technical effects and benefits. For instance, exposure of a workpiece with a process gas including a co-flow of HF gas an ozone gas can provide for the etching of titanium and/or titanium nitride with high selectivity relative to other materials one the workpiece. The etch process(s) according to example aspects can be all dry etch processes with a high etch rate (e.g., about 200 Angstroms per minute or greater). In addition, the process can be implemented in a processing chamber with or without a remote plasma source, leading to increased versatility in implementing the etch process in semiconductor fabrication equipment.

Aspects of the present disclosure are discussed with reference to a "workpiece" or "wafer" for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece. A low-k dielectric material can have a dielectric constant of less than about 3.0, such as less than about 2.5, such as less than about 2.2. "Ozone gas" refers to any gas that contains $O_3$. Ozone gas can be a mixture of $O_3$ and $O_2$.

FIG. 1 depicts an overview of an example process 110 for etching titanium and/or titanium nitride on a workpiece 60 according to example embodiments of the present disclosure. As shown, a workpiece 60 can include a substrate layer 62 (e.g., silicon layer or a silicon germanium layer) and a titanium containing layer 64 (e.g., titanium and/or titanium nitride). It can be desirable to etch the titanium containing layer selectively relative to other layers on the workpiece 60, such as the substrate layer 62. As shown in FIG. 1, an etch process 110 can include exposing workpiece 60, including the titanium containing layer 64 and the substrate layer to a process gas including HF gas (e.g., gas containing HF vapor) and an ozone gas. In some embodiments, the process gas can include a carrier gas, such as nitrogen or an inert gas (e.g., argon, helium, etc.). Exposing the workpiece 60 to the process gas can etch the titanium containing layer 64 by etch amount 65.

Figure 2:
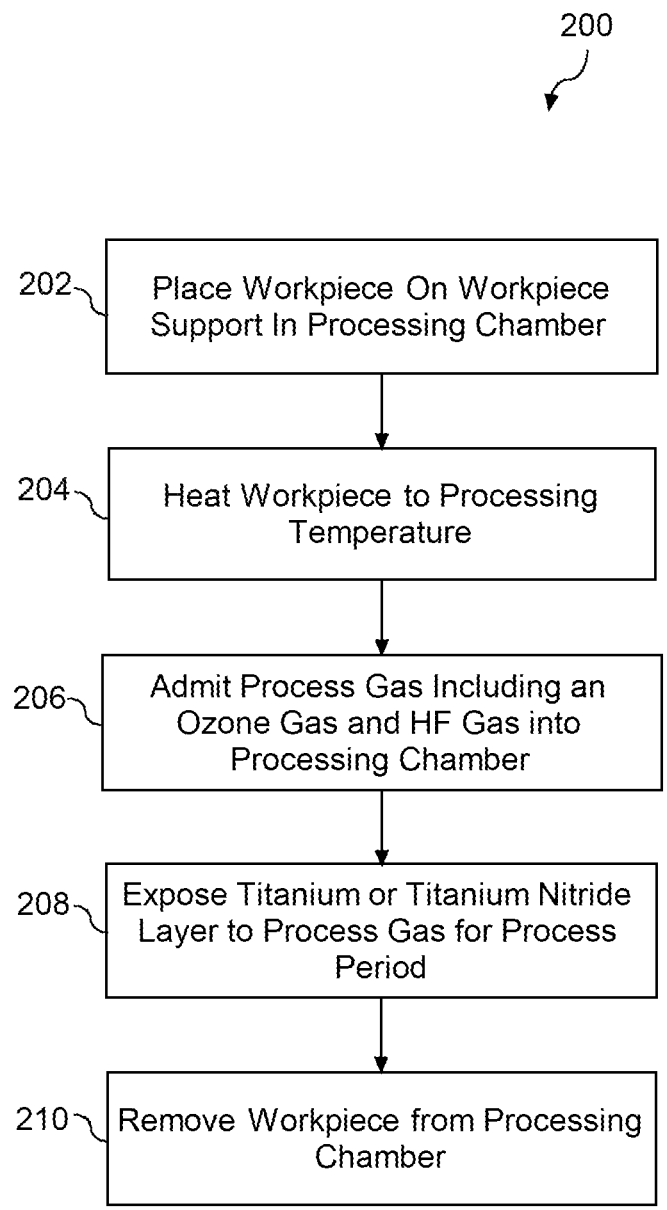
FIG. 2 depicts a flow diagram of an example method according to example embodiments of the present disclosure.

Example process parameters for the etch process 110 are provided below:

Workpiece processing temperature: about 100° C. to about 500° C.
Process pressure: about 100 mT to about 100 T
Process Gas: HF Gas and Ozone Gas and Carrier Gas
Carrier Gas: $N_2$, He, Ne, Xe, etc.
Total Process Gas Flow: about 100 sccm to about 100 slm.
HF Gas Flow: 10 sccm to about 10 slm
Ozone Gas Flow: 10 sccm to about 10 slm
Concentration of $O_3$ in Ozone Gas: about 1% to about 50% by volume
Processing Period: about 5 seconds to about 600 seconds FIG. 2 depicts a flow diagram of an example method (200) according to example aspects of the present disclosure. The method (200) can be implemented in a processing apparatus, such as any of the processing apparatus described herein. However, as will be discussed in detail below, the methods according to example aspects of the present disclosure can be implemented using other approaches without deviating from the scope of the present disclosure. FIG. 2 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (202), the method can include placing a workpiece on a workpiece support (e.g., pedestal) in a processing chamber. The workpiece can be a semiconductor wafer. In some embodiments, the workpiece can include a titanium layer and/or a titanium nitride layer. The workpiece can include other material layers, including one or more of silicon, polysilicon, silicon germanium, silicon nitride, silicon dioxide, metal(s) (e.g., tungsten), tantalum nitride, low-k material(s), etc.

At (204), the method can include heating the workpiece to a process temperature. The process temperature can be in the range of about 100° C. to about 500° C., such as about 150° C. to about 500° C.

At (206), the method can include admitting a process gas into the processing chamber. According to example aspects of the present disclosure, the process gas can include a co-flow of an ozone gas and an HF gas. In some embodiments, the HF gas can include an HF vapor. In some applications, the process gas can additionally include a carrier gas, such as a nitrogen gas or inert gas. A total flow rate of the process gas can be in the range of about 100 sccm to about 100 slm, such as about 100 sccm to about 10 slm, such as about 500 sccm to about 10 slm. A gas flow rate of the HF gas (e.g., including an HF vapor) can be in the range of about 10 sccm to about 10 slm, such as about 10 sccm to about 1 slm, such as about 50 sccm to about 1 slm. A gas flow rate of the ozone gas can be in the range of about 10 sccm to about 10 slm, such as about 10 sccm to about 1 slm, such as about 50 sccm to about 1 slm. A concentration of $O_3$ in the ozone gas can be in the range of about 1% to about 50%.

Figure 3:
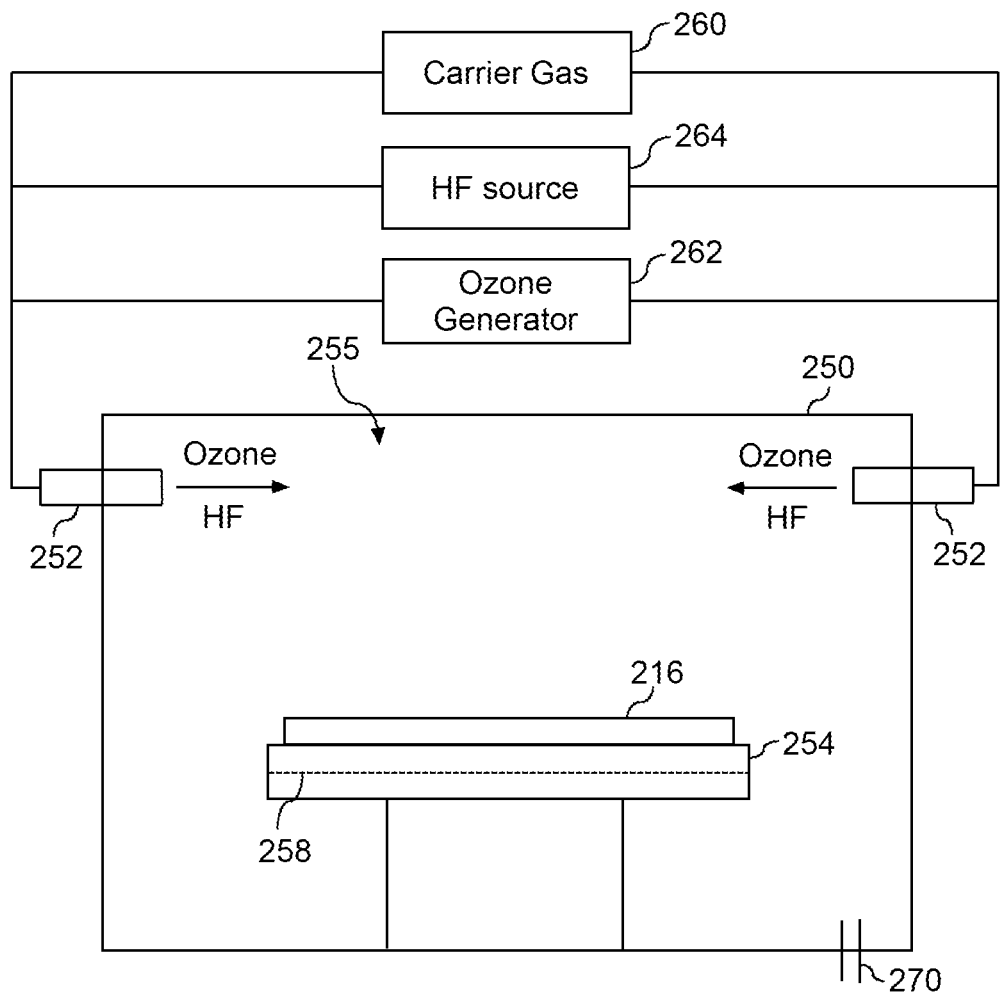
FIG. 3 depicts an example processing chamber configured to implement an etch process according to example embodiments of the present disclosure.

At (208) of FIG. 3, the method can include exposing the titanium and/or titanium nitride layer on the workpiece to the process gas, including the co-flow of the ozone gas and the HF gas, for a process period. The process period is the time the gas is exposed to the workpiece. In some embodiments, the process period can be in the range of about 5 seconds to about 600 seconds. In some embodiments, the process period can be in the range of about 30 seconds to about 90 seconds. After the process period the process gas can be evacuated from the process chamber.

At (210), the method can include removing the workpiece from the processing chamber. The processing chamber can then be treated and/or cleaned and a next workpiece can be placed in the processing chamber.

FIG. 3 depicts an example processing chamber 250 that can be used to implement the method (200) according to example aspects of the present disclosure. The processing chamber 250 can include an interior volume 255 configured to accommodate a workpiece 216. The workpiece 216 can be supported on workpiece support 254.

The workpiece can be heated using a temperature regulation system 258 associated with the workpiece support 254. The temperature regulation system 258 can include heating elements (e.g., electrically resistive heating elements) disposed on the workpiece support 254. In some embodiments, the temperature regulation system 258 can include one or more fluid channels operable to circulate a fluid through the workpiece support 254 to heat or cool the workpiece 216. Other suitable heat sources can be used without deviating from the scope of the present disclosure, such as lamp heat sources, lasers, plasma heat sources, etc.

In some embodiments, a control system can regulate the temperature of the workpiece to a temperature setpoint. For instance, one or more sensors (e.g., pyrometers, temperature sensors, etc.) can be used to provide signals indicative of the temperature of the workpiece during the surface treatment process. The temperature regulation system 258 can heat and/or cool the workpiece based on the signals indicative of the temperature of the workpiece to regulate the temperature of the workpiece to the temperature setpoint.

Gas injection ports 252 that can be used to admit the process gas into the processing chamber interior 255. Other suitable methods and/or apparatus can be used to admit the process gas into the process chamber without deviating from the scope of the present disclosure. For instance, the process gas can be admitted via a showerhead or other suitable gas injection source. As discussed above, the process gas can include a co-flow of an ozone gas and an HF gas (e.g., including an HF vapor). In some embodiments, the process gas can additionally include a carrier gas, such as a nitrogen gas or inert gas. A total process gas flow rate can be in the range of about 100 sccm to about 100 slm, such as about 100 sccm to about 10 slm, such as about 500 sccm to about 10 slm. A gas flow rate of the HF gas (e.g., including an HF vapor) can be in the range of about 10 sccm to about 10 slm, such as about 10 sccm to about 1 slm, such as about 50 sccm to about 1 slm. A gas flow rate of the ozone gas can be in the range of about 10 sccm to about 10 slm, such as about 10 sccm to about 1 slm, such as about 50 sccm to about 1 slm.

For instance, as illustrated, the gas injection port 252 can be coupled to an ozone generator 262. The ozone generator 262 can generate an ozone gas that is directly fed to the interior volume 255 via gas injection ports 252. The ozone gas can include a mixture of $O_2$ and $O_3$. A concentration of $O_3$ in the ozone gas can be in the range of about 1% to about 50%. The HF gas can be directly fed into the interior volume 255 via gas injection ports 252 from an HF gas source 264 (HF bottle). In some embodiments, the HF gas can be an HF vapor. A carrier gas can be directly fed into the interior volume 255 via gas injection ports 252 from a carrier gas source 266 (carrier gas bottle). The carrier gas can be nitrogen gas and/or an inert gas.

The process gas can be exposed to the workpiece for a process period. The process period can be in the range of about 5 seconds to about 600 seconds. In some embodiments, the process period can be in the range of about 30 seconds to about 90 seconds. After the process period, the process gas can be evacuated from the process chamber (e.g., using a pump port 270).

Figure 4:
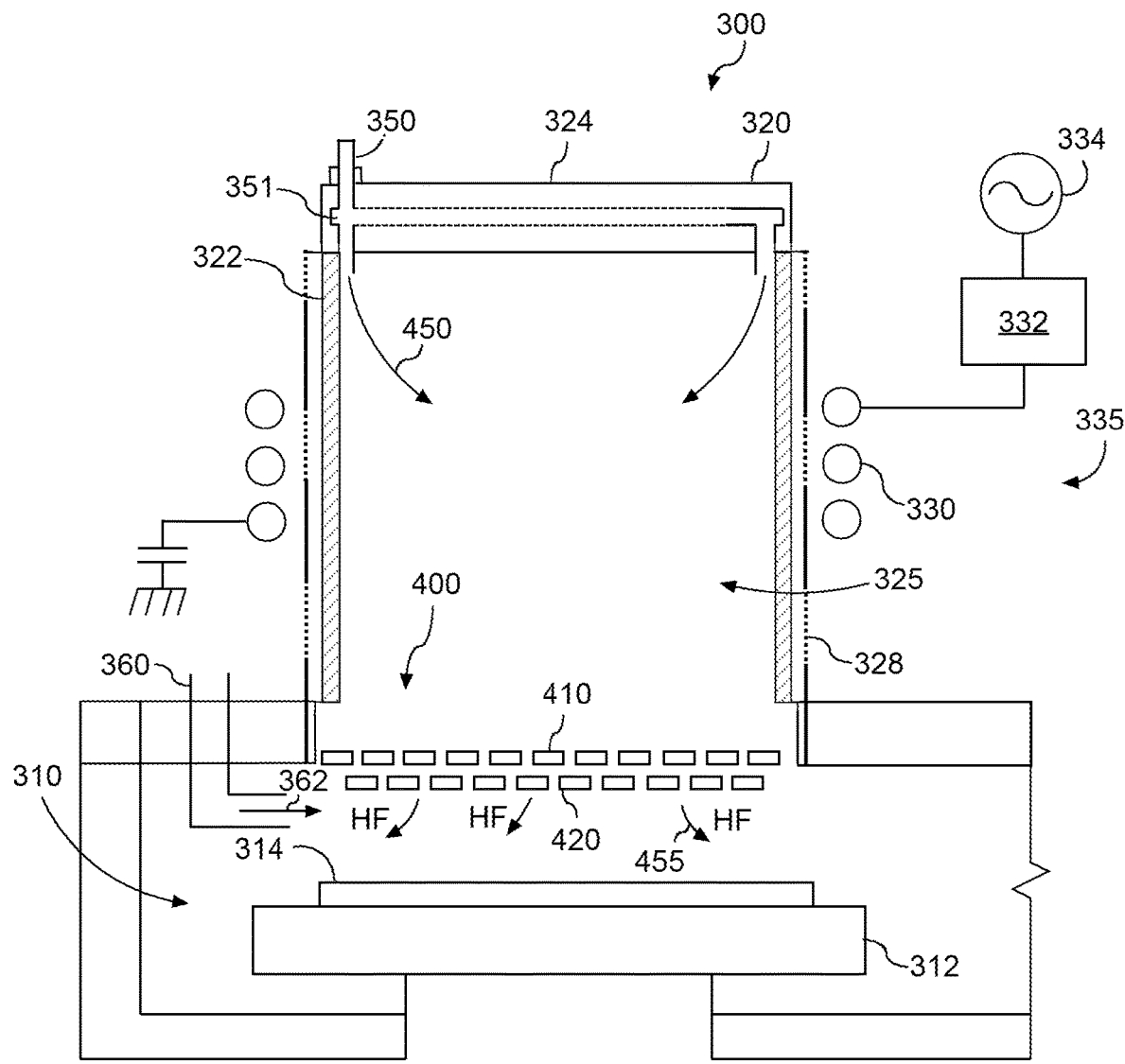
FIG. 4 depicts an example plasma processing apparatus configured to implement a surface treatment process according to example embodiments of the present disclosure.

In some embodiments, the HF gas (e.g., HF vapor) can be generated using a remote plasma source. FIG. 4 depicts an example processing apparatus 300 that can be used to implement the etch process according to example embodiments of the present disclosure. The processing apparatus 300 is a plasma processing apparatus with an inductively coupled plasma source. As illustrated, the plasma processing apparatus 300 includes a processing chamber 310 and a plasma chamber 320 that is separated from the processing chamber 310. The processing chamber 310 includes a substrate holder or workpiece support 312 operable to hold a workpiece 314 to be processed, such as a semiconductor wafer. In this example illustration, a plasma can generated in the plasma chamber 320 (i.e., plasma generation region) by an inductively coupled plasma source 335 and desired species are channeled from the plasma chamber 320 to the surface of workpiece 314 through a separation grid assembly 400.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 320 can include a dielectric side wall 322 and a ceiling 324. The dielectric side wall 322, the ceiling 324, and the separation grid 400 define a plasma chamber interior 325. The dielectric side wall 322 can be formed from a dielectric material, such as quartz and/or alumina. The inductively coupled plasma source 335 can include an induction coil 330 disposed adjacent the dielectric side wall 322 about the plasma chamber 320. The induction coil 330 is coupled to an RF power generator 334 through a suitable matching network 332. Process gases (e.g., reactant and/or carrier gases) can be provided to the chamber interior from a gas supply 350 and an annular gas distribution channel 351 or other suitable gas introduction mechanism. When the induction coil 330 is energized with RF power from the RF power generator 334, a plasma can be generated in the plasma chamber 320. In a particular embodiment, the plasma processing apparatus 300 can include an optional grounded Faraday shield 328 to reduce capacitive coupling of the induction coil 330 to the plasma.

As shown in FIG. 3, the separation grid 400 separates the plasma chamber 320 from the processing chamber 310. The separation grid 400 can be used to perform ion filtering from a mixture generated by plasma in the plasma chamber 320 to generate a filtered mixture. The filtered mixture can be exposed to the workpiece 314 in the processing chamber 310.

In some embodiments, the separation grid 400 can be a multi-plate separation grid. For instance, the separation grid 400 can include a first grid plate 410 and a second grid plate 420 that are spaced apart in parallel relationship to one another. The first grid plate 410 and the second grid plate 420 can be separated by a distance.

The first grid plate 410 can have a first grid pattern having a plurality of holes. The second grid plate 420 can have a second grid pattern having a plurality of holes. The first grid pattern can be the same as or different from the second grid pattern. Charged particles can recombine on the walls in their path through the holes of each grid plate 410, 420 in the separation grid 400. Neutrals (e.g., radicals) can flow relatively freely through the holes in the first grid plate 410 and the second grid plate 420. The size of the holes and thickness of each grid plate 410 and 420 can affect transparency for both charged and neutral particles.

In some embodiments, the first grid plate 410 can be made of metal (e.g., aluminum) or other electrically conductive material and/or the second grid plate 420 can be made from either an electrically conductive material or dielectric material (e.g., quartz, ceramic, etc.). In some embodiments, the first grid plate 410 and/or the second grid plate 420 can be made of other materials, such as silicon or silicon carbide. In the event a grid plate is made of metal or other electrically conductive material, the grid plate can be grounded. In some embodiments, the separation grid 400 includes a single grid plate. In some embodiments, the separation grid includes three or more grid plates.

In some embodiments, the method of FIG. 2 can be implemented using the plasma processing apparatus 300 of FIG. 4. For instance, a workpiece 314 can be placed on the workpiece support 312. The workpiece 314 can include, for instance, a titanium and/or titanium nitride layer. The workpiece can be heated to a process temperature using, for instance, a temperature regulation system (not illustrated in FIG. 4), such as heaters in the workpiece support 312, fluid channels in the workpiece support 312, lamps, lasers, or other heat sources.

A process gas 450 can be admitted into the plasma chamber 325. The process gas can include, for instance, F containing gas(s) (e.g., $CF_4$, $NF_3$, $CF_xH_y$, etc.) and H containing gas(s) (e.g., $H_2$, $CH_4$, $C_2H_8$, etc.). The HF radicals 455 generated in the plasma can be delivered downstream from the plasma chamber 325 to the processing chamber 310 to be exposed to the workpiece 314.

An ozone gas 362 can be admitted from a gas injection port 360 directly into the processing chamber 310 (e.g., from an ozone generator). In this way, HF gas (e.g., HF radicals 455) and ozone gas 362 can be fed simultaneously into the processing chamber 310 for exposure to the workpiece 314 to implement the etch process(s) according to example aspects of the present disclosure.

Figure 5:
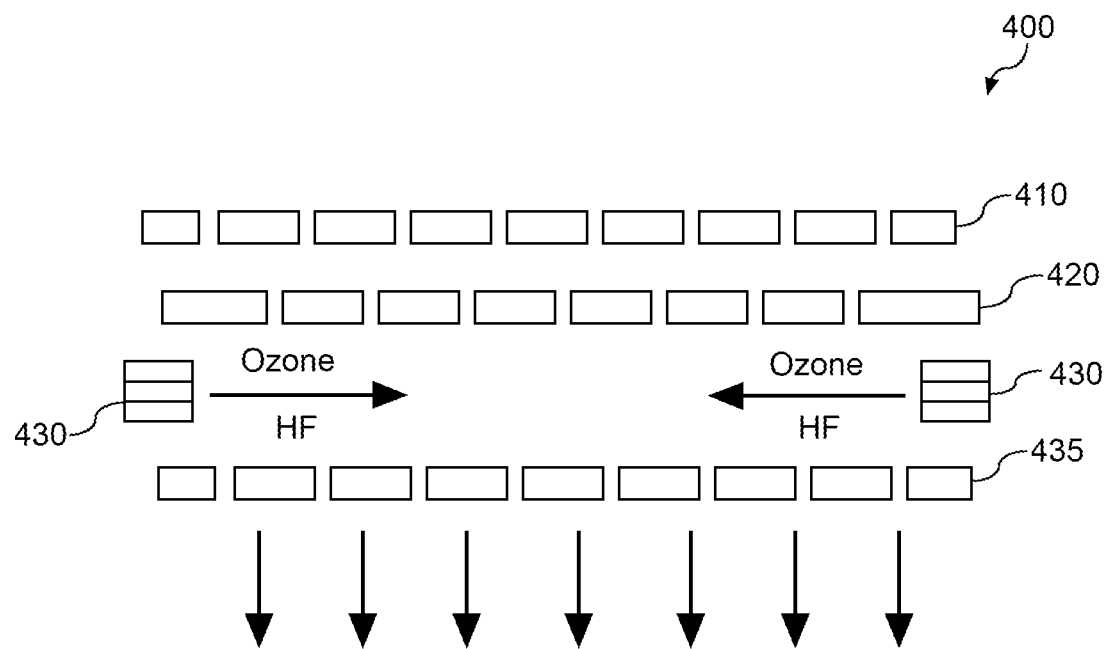
FIG. 5 depicts example injection of an ozone gas and/or HF gas at a separation grid according to example embodiments of the present disclosure.

The process gas including a co-flow of HF gas and ozone gas can be admitted into the processing chamber 310 in other ways without deviating from the scope of the present disclosure, such as using gas injection ports at or below the separation grid 400. For instance, FIG. 5 depicts example injection of a process gas at a separation grid according to example embodiments of the present disclosure. More particularly, the separation grid 400 includes a first grid plate 410 and a second grid plate 420 disposed in parallel relationship for ion/UV filtering.

The first grid plate 410 and a second grid plate 420 can be in parallel relationship with one another. The first grid plate 410 can have a first grid pattern having a plurality of holes. The second grid plate 420 can have a second grid pattern having a plurality of holes. The first grid pattern can be the same as or different from the second grid pattern. Subsequent to the second grid plate 420, a gas injection source 430 can be configured to admit a gas at the separation grid. The gas can pass through a third grid plate 435 for exposure to the workpiece. In some embodiments, the gas injected from gas injection source 430 can be an ozone gas. The ozone gas can be injected into other components of a process gas (e.g., HF gas and/or carrier gas) passing through the separation grid 400. In some embodiments, the process gas (e.g., ozone gas, HF gas, and/or carrier gas) can be admitted into the separation grid 400 from the gas injection source 430.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the gas injection source 430 can be located at other locations relative to the separation grid 400, such as between the first grid plate 410 and the second grid plate 420, below the third grid plate 435, or below the entire separation grid 400. The gas injection source 430 can inject gas at any angle with respect to the separation grid 400.

Figure 6:
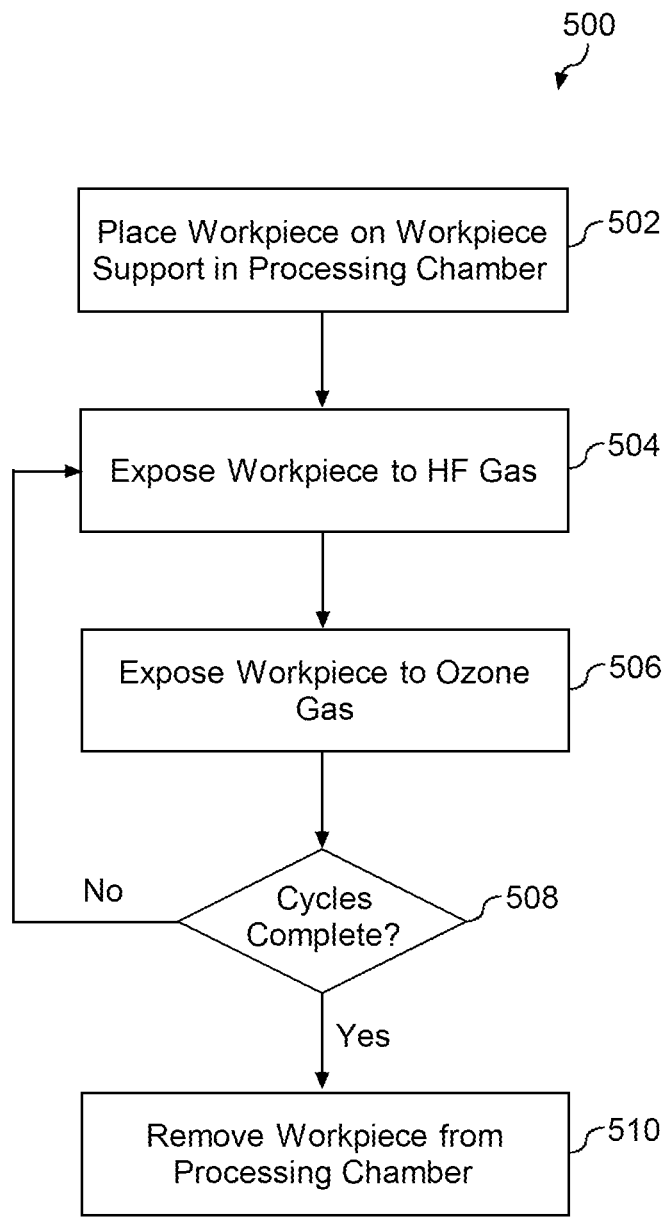
FIG. 6 depicts a flow diagram of an example method according to example embodiments of the present disclosure.

FIG. 6 depicts a flow diagram of an example method (500) according to example aspects of the present disclosure. The method (500) can be implemented in a processing apparatus, such as any of the processing apparatus described herein. However, as will be discussed in detail below, the methods according to example aspects of the present disclosure can be implemented using other approaches without deviating from the scope of the present disclosure. FIG. 6 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (502), the method can include placing a workpiece on a workpiece support (e.g., pedestal) in a processing chamber. The workpiece can be a semiconductor wafer. In some embodiments, the workpiece can include a titanium layer and/or a titanium nitride layer. The workpiece can include other material layers, including one or more of silicon, polysilicon, silicon germanium, silicon nitride, silicon dioxide, metal(s) (e.g., tungsten), tantalum nitride, low-k material(s), etc.

At (504), the method can include exposing the workpiece to a first process gas including an HF gas. In some embodiments, the HF gas can include HF vapor. The HF gas can be directly admitted into the processing chamber and/or generated using a remote plasma source as described herein. The first process gas can include a carrier gas. In some embodiments, the first process gas does not include an ozone gas.

At (506), the method can include exposing the workpiece to a second process gas into the processing chamber. The second process gas can include an ozone gas. In some embodiments, the second process gas is admitted after exposure of the workpiece to the first process gas. The second process can include a carrier gas. In some embodiments, the second process gas does not include an HF gas.

As shown at (508), the blocks (504) and (506) can be repeated in cyclic fashion to etch the titanium and/or titanium nitride layer on the workpiece. Each cycle can remove a small number of Angstroms (e.g. about 1 to about 5 Angstroms) of titanium nitride and/or titanium. This can provide for precise control of the etching process by control of the number of cycles.

At (510), the method can include removing the workpiece from the processing chamber. The processing chamber can then be treated and/or cleaned, and a next workpiece can be placed in the processing chamber.

Figure 7:
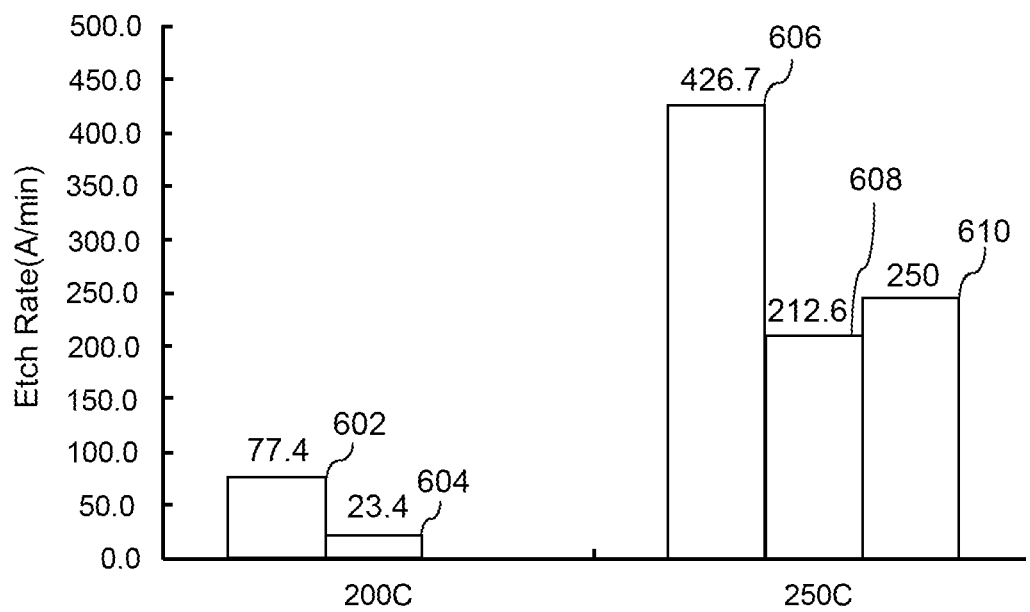
FIG. 7 depicts example process results according to example embodiments of the present disclosure.

FIG. 7 depicts example process results according to example embodiments of the present disclosure. FIG. 7 depicts example etch rate for titanium nitride and titanium layers at different temperatures by exposure to a co-flow of HF gas and ozone gas according to example embodiments of the present disclosure. FIG. 7 plots temperature on the horizontal axis and etch rate along the vertical axis. Bar 602 depicts the etch rate for titanium nitride deposited using physical vapor deposition resulting from exposure of the workpiece to a co-flow of HF gas and ozone gas at 200° C. Bar 604 depicts the etch rate for titanium nitride deposited using atomic layer deposition resulting from exposure of the workpiece to a co-flow of HF gas and ozone gas at 200° C. Bar 606 depicts the etch rate for titanium nitride deposited using physical vapor deposition resulting from exposure of the workpiece to a co-flow of HF gas and ozone gas at 250° C. Bar 608 depicts the etch rate for titanium nitride deposited using atomic layer deposition resulting from exposure of the workpiece to a co-flow of HF gas and ozone gas at 250° C. Bar 610 depicts the etch rate for titanium resulting from exposure of the workpiece to a co-flow of HF gas and ozone gas at 250° C.

Figure 8:
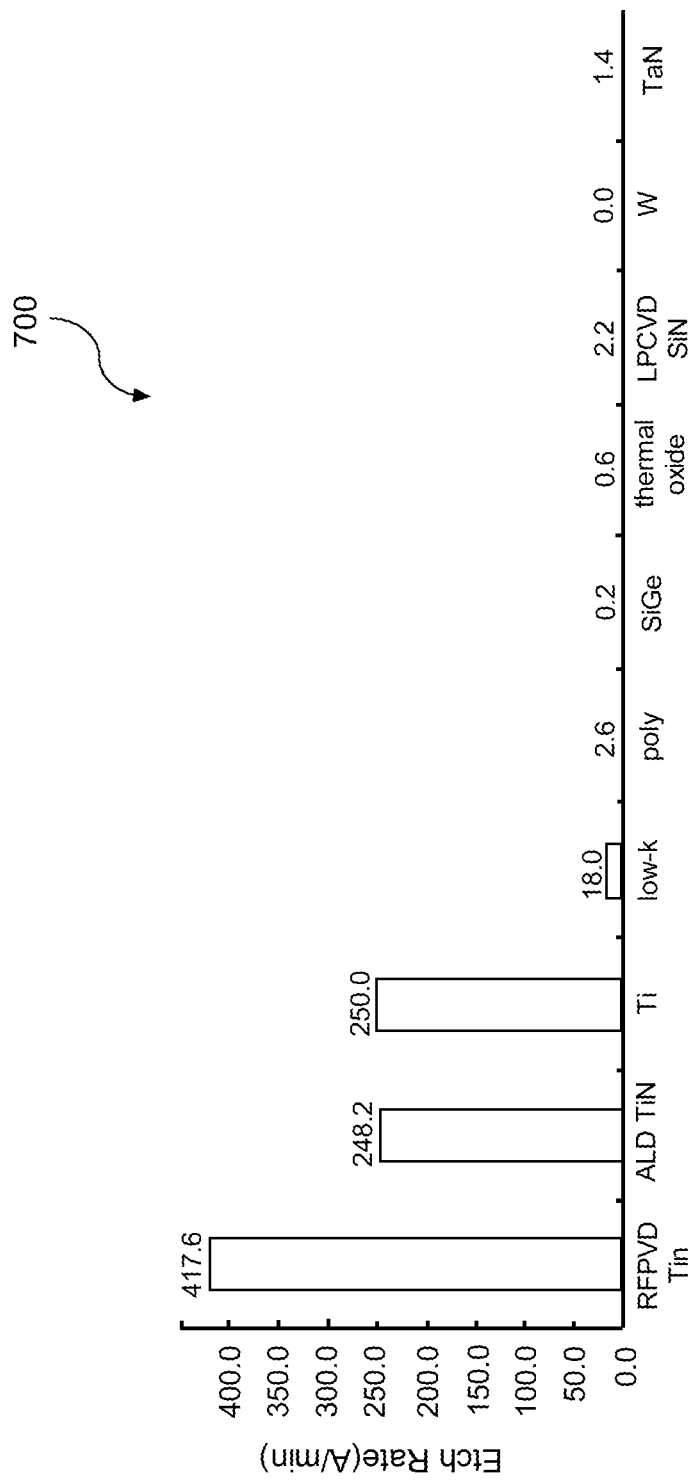
FIG. 8 depicts example process results according to example embodiments of the present disclosure.

FIG. 8 depicts example process results 700 for etching titanium nitride selectivity relative to various materials when using a co-flow of ozone gas and HF gas according to example aspects of the present disclosure. FIG. 8 plots various materials along the horizontal axis. FIG. 8 plots etch rate along the vertical axis. The example process results 700 are summarized in the Table below.

| Material | Etch amount (Angstroms) | Selectivity (with respect to RFPVD Titanium Nitride) |
|---|---|---|
| RFPVD TiN | 208.8 | — |
| ALD TiN | 124.1 (film all gone, etch amount could be higher | — |
| Ti | 500 Angstrom film removed for 2 min etch | — |
| Low-k | 9.0 | 23.2 |
| Polysilicon | 1.3 | 160.6 |
| SiGe | 0.1 | 2088.0 |
| Thermal Oxide | 0.3 | 696.0 |
| LPCVD SiN | 1.1 | 189.8 |
| W | 0 (no Rs increase) | >200 |
| TaN | 2.8 Angstrom for 2 min etch | 298.3 |

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method of processing a workpiece, comprising:
    placing the workpiece on a workpiece support in a processing chamber, the workpiece comprising a titanium containing layer and a silicon containing layer,
    admitting a first process gas into the processing chamber, the first process gas comprising an HF gas formed by a remote plasma using a remote plasma source;
    exposing the titanium containing layer and the silicon containing layer on the workpiece to the first process gas;
    after exposing the titanium containing layer and the silicon containing layer on the workpiece to the first process gas, admitting a second process gas into the processing chamber, the second process gas comprising an ozone gas;
    exposing the titanium containing layer and the silicon containing layer on the workpiece to the second process gas.

2. The method of claim 1, wherein the silicon containing layer comprises silicon germanium.

3. The method of claim 1, wherein the titanium containing layer comprises titanium nitride.

4. The method of claim 1, wherein the first process gas does not include ozone gas.

5. The method of claim 1, wherein the second process gas does not include HF gas.

6. The method of claim 1, wherein the method comprises cyclically repeating admitting a first process gas into the processing chamber; exposing the titanium containing layer and the silicon containing layer on the workpiece to the first process gas; after exposing the titanium containing layer and the silicon containing layer on the workpiece to the first process gas, admitting a second process gas into the processing chamber; and exposing the titanium containing layer and the silicon containing layer on the workpiece to the second process gas.

* * * * *